United States Patent
Ao Ieong et al.

(10) Patent No.: US 8,570,099 B2
(45) Date of Patent: Oct. 29, 2013

(54) SINGLE-ENDED-TO-DIFFERENTIAL FILTER USING COMMON MODE FEEDBACK

(75) Inventors: Ka Hou Ao Ieong, Macau (MO); Seng Pan U, Macau (MO)

(73) Assignee: Synopsys, Inc., Mountain View, CA (US)

( * ) Notice: Subject to any disclaimer, the term of this patent is extended or adjusted under 35 U.S.C. 154(b) by 85 days.

(21) Appl. No.: 13/161,301

(22) Filed: Jun. 15, 2011

(65) Prior Publication Data

US 2012/0319767 A1    Dec. 20, 2012

(51) Int. Cl.
*H03B 1/00* (2006.01)
*H04B 1/10* (2006.01)

(52) U.S. Cl.
USPC .............................. 327/551; 327/552; 327/558

(58) Field of Classification Search
None
See application file for complete search history.

(56) References Cited

U.S. PATENT DOCUMENTS

| | | | |
|---|---|---|---|
| 4,979,218 A * | 12/1990 | Strahm | 381/94.6 |
| 5,049,831 A * | 9/1991 | Westwick | 330/107 |
| 5,359,294 A * | 10/1994 | Ganger et al. | 330/258 |
| 5,391,999 A * | 2/1995 | Early et al. | 327/337 |
| 6,150,881 A * | 11/2000 | Lovelace et al. | 330/252 |
| 6,316,970 B1 * | 11/2001 | Hebert | 327/67 |
| 6,559,723 B2 * | 5/2003 | Hollenbeck et al. | 330/301 |
| 7,777,575 B2 * | 8/2010 | Stockinger et al. | 330/301 |

* cited by examiner

*Primary Examiner* — Tuan T Lam
(74) *Attorney, Agent, or Firm* — Bever, Hoffman & Harms, LLP; Jeanette S. Harms

(57) ABSTRACT

A filter including common mode feedback can provide single-ended to differential-ended conversion with minimum loss of performance.

15 Claims, 5 Drawing Sheets

SINGLE-ENDED-TO-DIFFERENTIAL FILTER USING COMMON MODE FEEDBACK

BACKGROUND OF THE INVENTION

1. Field of the Invention

The present invention relates to a filter including common mode feedback that provides single-ended to differential-ended conversion with minimum loss of performance.

2. Related Art

Differential topologies for integrated circuit (IC) analog signal processing offer numerous advantages, e.g. robustness to crosstalk and improved linearity. However, many source signals, such as video signals, are only available in single-ended format and therefore must be converted to differential format before processing begins.

The conversion to differential format can be done efficiently on an analog-to-digital conversion (ADC) input stage implemented with switched-capacitors. However, in many applications, an anti-aliasing filter must precede the ADC. In such applications, a single-ended-to-differential (SE-to-DE) conversion is typically done before the filter to retain the advantages of improved linearity and robustness to crosstalk.

Several solutions exist to provide this SE-to-DE conversion, each with its own drawbacks. In one solution, one relies on the common mode feedback (CMFB) of the differential amplifier used on the first stage of the filter that, by feedback, forces its output to be differential. FIG. 1 illustrates this solution.

As shown in FIG. 1, a filter 100 essentially reconstructs the differential format at the output. In the embodiment shown in FIG. 1, filter 100 includes a first path that serially connects a differential voltage input terminal $V_{I+}$, a buffer 101A, a resistor $R_{1A}$, and an RC circuit comprising a resistor $R_{2A}$, a capacitor $C_A$ connected in parallel, and a differential voltage output terminal $V_{O-}$. Filter 100 also includes a second path that serially connects a differential voltage input terminal $V_{I-}$, a buffer 101B, a resistor $R_{1B}$, an RC circuit comprising a resistor $R_{2B}$ and a capacitor $C_B$ connected in parallel, and a differential voltage output terminal $V_{O+}$. Note that although filter 100 includes both differential voltage input terminal $V_{I+}$ and $V_{I-}$, differential voltage input terminal $V_{I-}$ receives a DC signal and therefore filter 100 is technically a single-ended input.

To provide the above-described reconstruction, a differential amplifier 102 is connected to the two RC circuits. Specifically, a first terminal of resistor $R_{2A}$ (i.e. that terminal connected to resistor $R_{1A}$) is connected to a positive input terminal of differential amplifier 102, a first terminal of resistor $R_{2B}$ (i.e. that terminal connected to resistor $R_{1B}$) is connected to a negative input terminal of differential amplifier 102, a second terminal of resistor $R_{2A}$ (i.e. that terminal connected to differential voltage output terminal $V_{O-}$) is connected to a negative output terminal of differential amplifier 102, and a second terminal of resistor $R_{2B}$ (i.e. that terminal connected to differential voltage output terminal $V_{O+}$) is connected to a positive output terminal of differential amplifier 102. Note that differential amplifier 102 receives a common mode signal at terminal $V_{CMO}$.

Filter 100 can minimize consumption and area because it re-uses hardware that is already present in the differential filter topology. However, filter 100 does not retain the advantages of differential processing because the virtual ground has a common mode signal swing, thereby leading to poor linearity (especially if switches are used in the signal path for programming).

FIG. 2 illustrates another filter 200 that can provide SE-to-DE conversion. In this embodiment, filter 200 includes operational amplifiers 201A, 201B, and 201C. The negative input terminals of operational amplifiers 201A and 201B are connected to the differential input terminal $V_{I+}$, whereas the negative input terminal of operational amplifiers 201C is connected to the differential input terminal $V_{I-}$ (this terminal receiving a DC signal). Resistors r1-r4 are serially connected between the output terminals of operational amplifiers 201A and 201C. A node between resistors r1 and r2 is connected to the positive input terminal of operational amplifier 201A, a node between resistors r2 and r3 is connected to the output terminal of operational amplifier 201B, and a node between resistors r3 and r4 is connected to the positive input terminal of operational amplifier 201C.

Filter 200 further includes a resistor $R_A$ connected between the output terminal of operational amplifier 201A and an RC circuit comprising a capacitor $C_A$ and a resistor $R_A/2$ (wherein $R_A/2$ also designates the relative value based on resistor $R_A$), which are connected in parallel. A resistor $R_B$ connected between the output terminal of operational amplifier 201C and an RC circuit comprising a capacitor $C_B$ and a resistor $R_B/2$ (wherein $R_B/2$ also designates the relative value based on resistor $R_B$), which are connected in parallel. A differential amplifier 202 is connected to the RC circuits. Specifically, a positive input terminal of differential amplifier 202 is connected to a node between resistors $R_A$ and $R_A/2$, a negative input terminal of differential amplifier 202 is connected to a node between resistors $R_B$ and $R_B/2$, a positive output terminal of differential amplifier 202 is connected to the positive output terminal $V_{O+}$, and a negative output terminal of differential amplifier 202 is connected to the negative output terminal $V_{O-}$ of differential amplifier 202. Note that differential amplifier 202 outputs a common mode signal at terminal $V_{CMO}$.

In this configuration, filter 200 effectively has the SE-to-DE stage before the filter stage (circuit around 202). This solution provides the above-described advantages of differential processing, but undesirably increases area and energy consumption (compared to filter 100) for the SE-to-DE converter by including operational amplifiers 201A, 201B, and 201C.

Therefore, a need arises for an SE-to-DE stage in a filter that provides such advantages with minimal area and energy consumption.

SUMMARY OF THE INVENTION

A method of providing single-ended to differential-ended signal conversion in a filter is provided. This method includes connecting a common mode feedback circuit to first and second paths of the filter. The first and the second paths receive an analog signal and a DC signal, and generate positive and negative differential outputs. The common mode feedback circuit can receive a first voltage from the first path and a second voltage from the second path, and generate a common mode voltage based on the first and the second voltages. The common mode feedback circuit can compare the common mode voltage to a reference voltage and then modify the first and second voltages based on that comparison.

In one embodiment, the filter can include a first buffer for receiving the analog signal, first and second resistors, and a second buffer, wherein the first buffer, the first and second resistors, and the second buffer are connected in series. A first capacitor can be connected between an input of the second buffer and ground. The filter can further include a third buffer receiving a DC signal, third and fourth resistors, and a fourth buffer, wherein the third buffer, third and fourth resistors, and the fourth buffer are connected in series. A second capacitor can be connected between an input of the fourth buffer and ground.

The common mode feedback circuit of the filter can be connected between the first, second, third, and fourth resistors. The common mode feedback circuit can compare the common mode voltage and the reference voltage and, based on that comparison, modify voltages on the second and the fourth resistors by the application of current. The second buffer outputs a first differential voltage and the fourth buffer outputs a second differential voltage.

The common mode feedback circuit can include a common mode sensing circuit for receiving a first voltage output by the first resistor and a second voltage output by the third resistor, wherein the common mode sensing circuit generates the common mode voltage. The common mode feedback circuit can further include an amplifier as well as first and second transconductors. The amplifier can receive the common mode voltage on a positive input terminal and the reference voltage on a negative input terminal. The first transconductor can be connected between an output of the amplifier and a first node between the first and the second resistors. The second transconductor can be connected between the output of the amplifier and a second node between the third and the fourth resistors.

In another embodiment, the filter can include a first buffer for receiving an analog signal, a first resistor, and a first RC network, wherein the first buffer, first resistor, and first RC network are connected in series. The first RC network can include a second resistor and a first capacitor connected in parallel. The filter can further include a second buffer receiving a DC signal, a third resistor, and a second RC network, wherein the second buffer, third resistor, and second RC network are connected in series. The second RC network can include a fourth resistor and a second capacitor connected in parallel.

In this embodiment, the common mode feedback circuit can be connected between the first, second, third, and the fourth resistors. A differential amplifier can be connected to the first and the second RC networks. In this configuration, the common mode feedback circuit can compare a common mode voltage and a reference voltage and, based on that comparison, modify voltages provided to the second and the fourth resistors. The first RC network outputs a first differential voltage and the second RC network outputs a second differential voltage. The common mode feedback circuit can have the configuration described above.

The differential amplifier can include a positive input terminal connected to an input of the first RC network and a negative input terminal connected to an input of the second RC network. The differential amplifier can also include a negative output terminal connected to an output of the first RC network and a positive output terminal connected to an output of the second RC network. The output of the negative output terminal of the differential amplifier provides a negative differential output of the filter, whereas the output of the positive output terminal of the differential amplifier provides a positive differential output of the filter. The differential amplifier can also include a common mode voltage terminal.

DETAILED DESCRIPTION OF THE FIGURES

In accordance with one aspect of an improved filter, a common mode feedback circuit can be provided in the filter. This improved filter can provide single-ended to differential-ended signal conversion without loss of performance. In one embodiment, the improved filter can be positioned at the input of an analog signal processing circuit.

Figure 1:
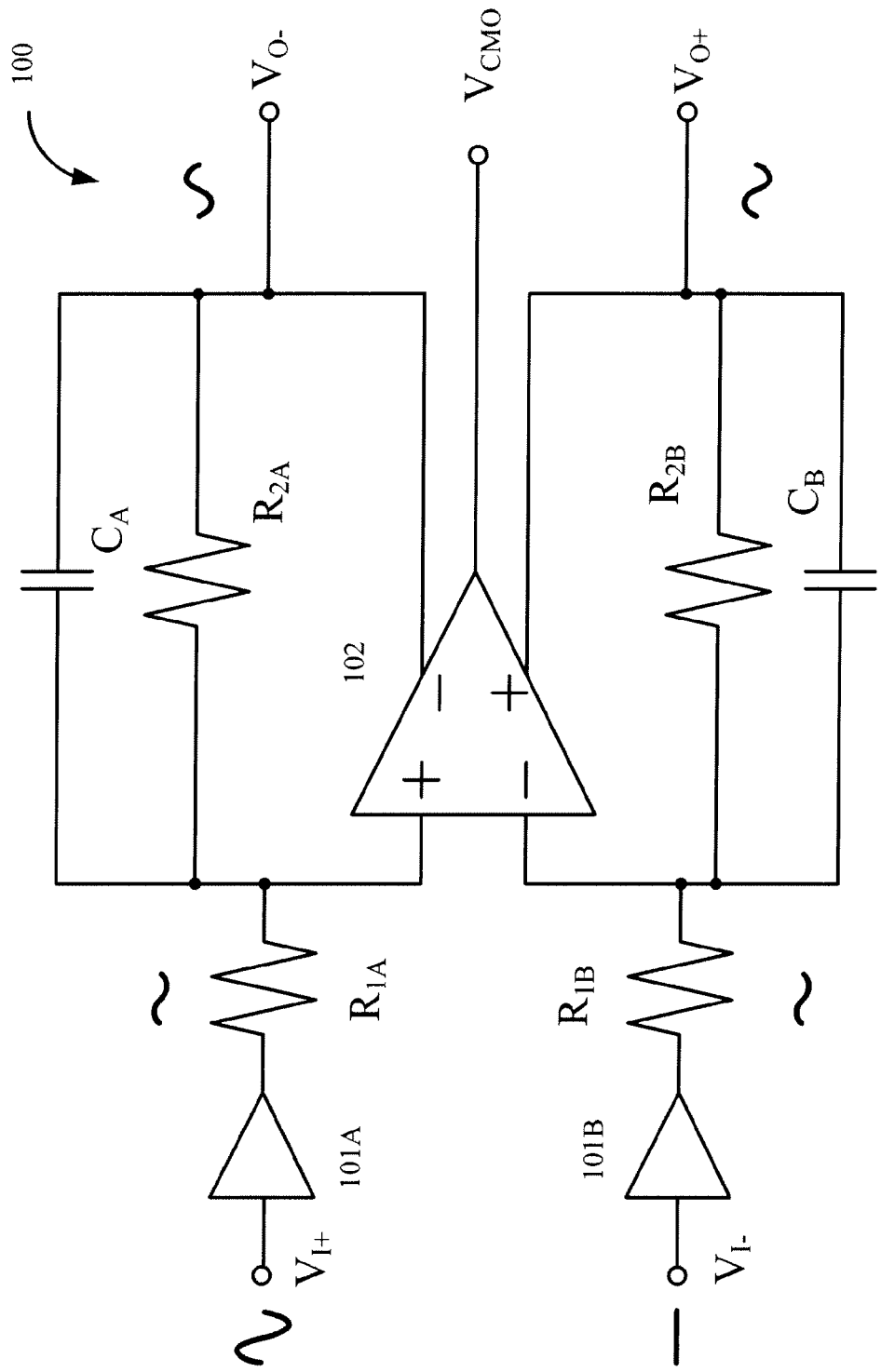
FIG. 1 illustrates a known filter having common mode feedback that reconstructs the differential format at the output, but still has common mode signals in the signal path.
Figure 2:
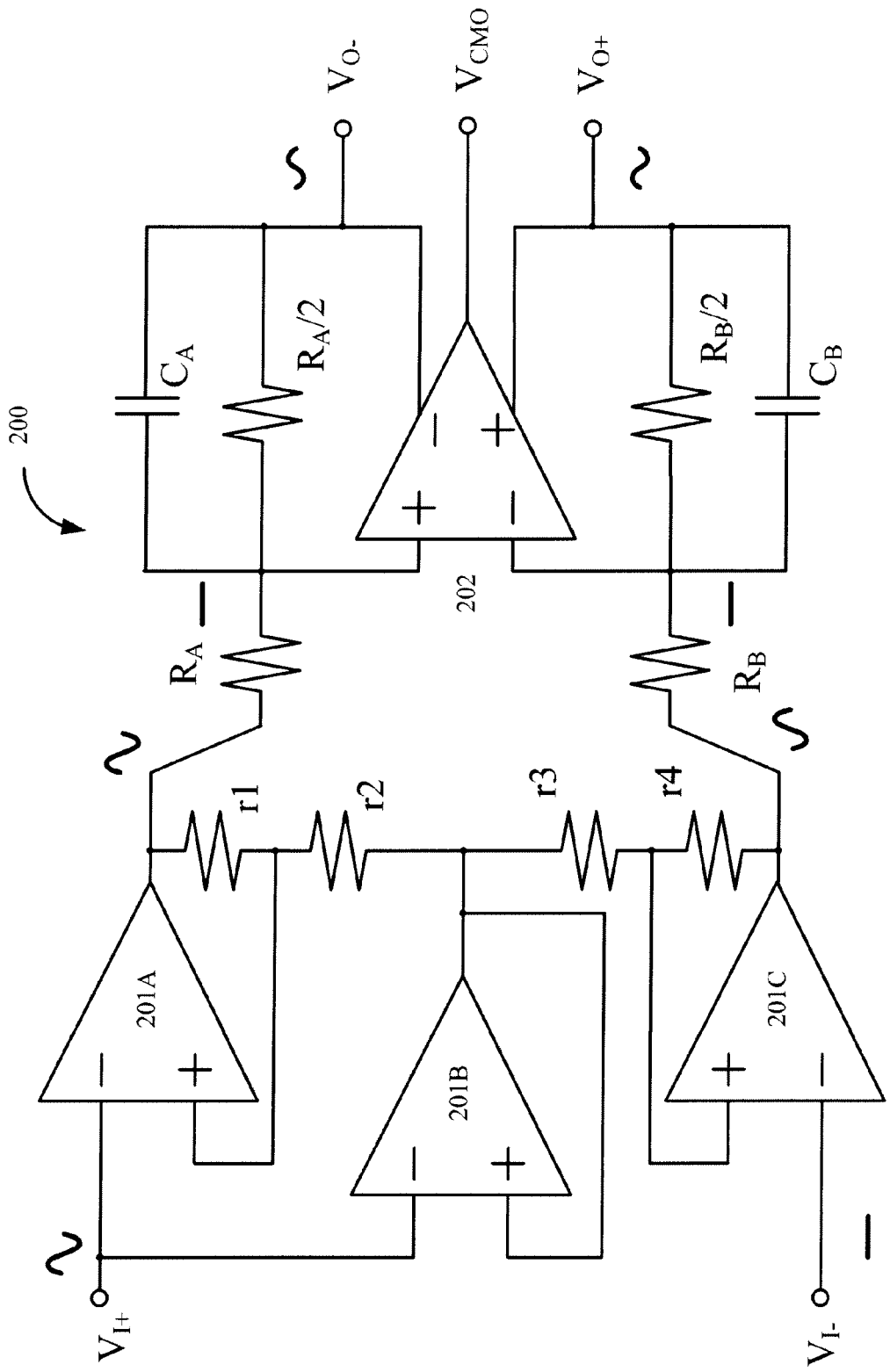
FIG. 2 illustrates another known filter having a single-ended-to-differential converter at the input that allows full differential processing, but at the expense of area and consumption.
Figure 3:
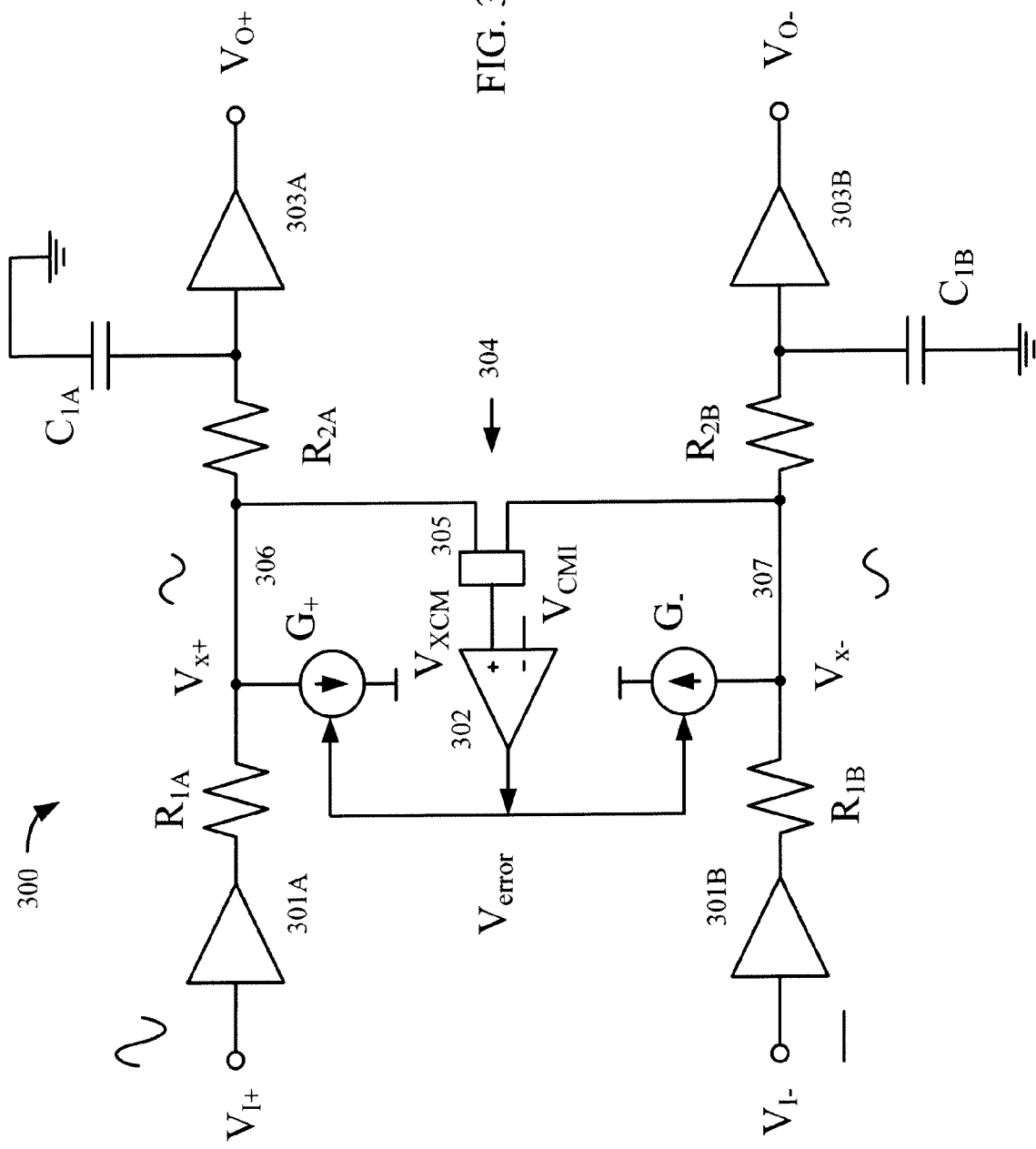
FIG. 3 illustrates an exemplary filter having a single-ended-to-differential converter as implemented in an open-loop based filter.

FIG. 3 illustrates an improved filter 300, which includes this common mode feedback circuit. In this embodiment, filter 300 includes a first path including a buffer 301A, a resistor $R_{1A}$, a resistor $R_{2A}$, and a buffer 303A connected in series between a positive input differential terminal $V_{I+}$ and a positive input differential terminal $V_{O+}$. A capacitor $C_{1A}$ is connected between the input terminal of buffer 303A and ground. Filter 300 also includes a second path including a buffer 301B, a resistor $R_{1B}$, a resistor $R_{2B}$, and a buffer 303B connected in series between a negative input differential terminal $V_{I-}$ and a negative input differential terminal $V_{O-}$. A capacitor $C_{1B}$ is connected between the input terminal of buffer 303B and ground.

A common mode feedback circuit 304 is connected between the resistors of filter 300. Circuit 304 includes two transconductors $G_+$ and $G_-$, an amplifier 302, and a common mode (CM) sensing circuit 305. In this embodiment, transconductor $G_+$ is connected to a node 306 between resistors $R_{1A}$ and $R_{2A}$, whereas transconductor $G_-$ is connected to a node 307 between resistors $R_{1B}$ and $R_{2B}$. CM sensing circuit 305 has inputs connected to nodes 306 and 307, and an output (voltage $V_{XCM}$) connected to a positive terminal of amplifier 302. The negative terminal of amplifier 302 is connected to a common mode reference voltage $V_{CMI}$. An output of amplifier 302 (providing voltage $V_{error}$) is connected to inputs of transconductors $G_+$ and $G_-$. Both transconductors $G_+$ and $G_-$ and CM sensing circuit 305 can be implemented using standard configurations and therefore are not discussed in detail herein.

In the above-described embodiment of filter 300, CM sensing circuit 305 monitors the voltages $V_{X+}$ and $V_{X-}$ on nodes 306 and 307, respectively, to generate the common mode voltage $V_{XCM}$. Amplifier 302 compares the common mode voltage $V_{XCM}$ with the common mode reference voltage $V_{CMI}$ and amplifies the difference between those voltages to generate voltage $V_{error}$. Voltage $V_{error}$ can be fed back as current though transconductors $G_+$ and $G_-$ to nodes 306 and 307, respectively.

Common mode feedback circuit 304 can advantageously provide a high common mode impedance loading. In fact, because the feedback in current (through G+ and G−), there is no loading of nodes 306 and 307 that could affect performance. Notably, the advantages of differential processing are retained while reducing complexity (compared to, for example, filter 200), thereby resulting in low area and low power consumption.

Figure 4:
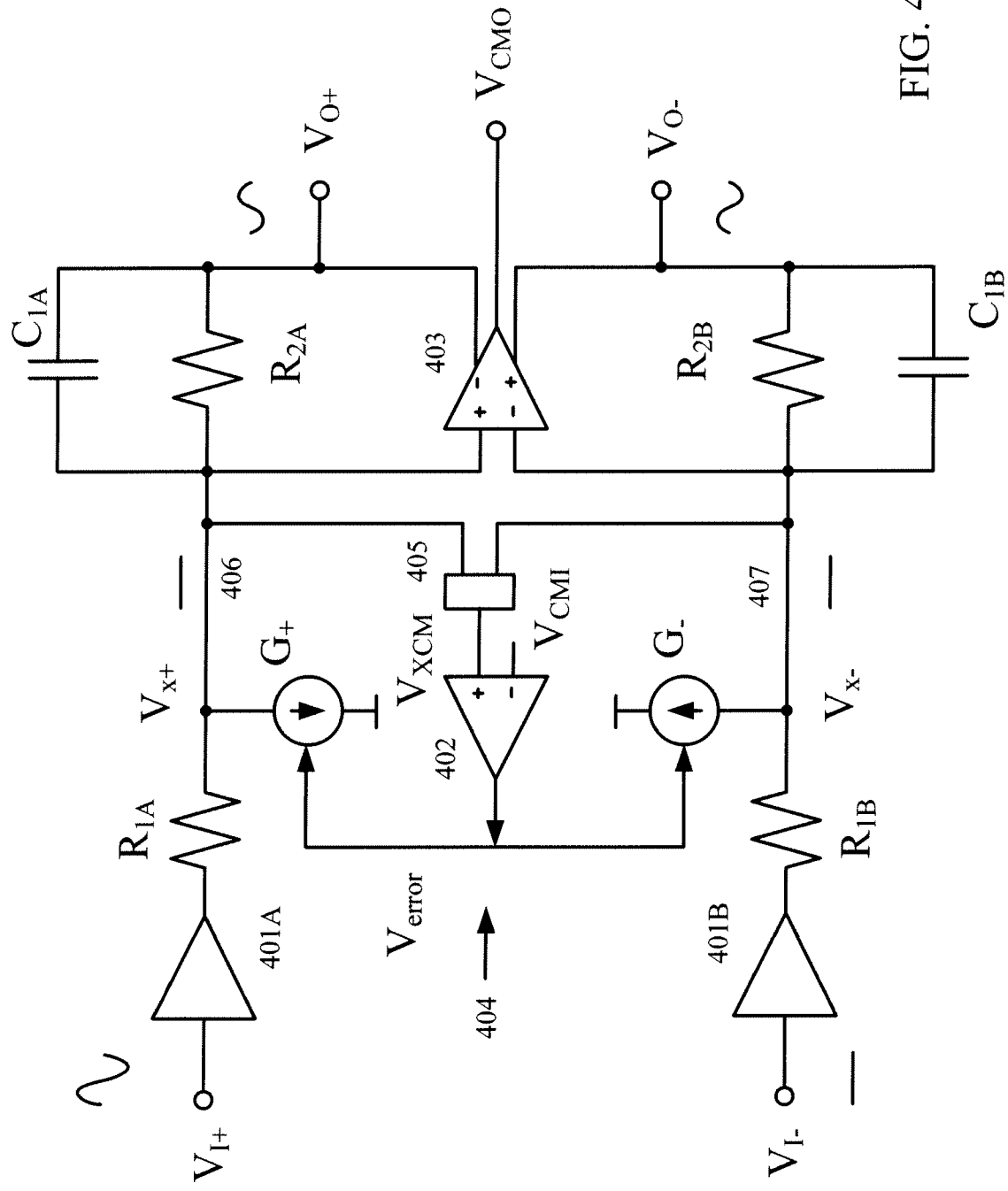
FIG. 4 illustrates another exemplary filter having a single-ended-to-differential converter as implemented in a closed-loop based filter.

FIG. 4 illustrates another improved filter 400, which also includes a common mode feedback circuit 404. In this embodiment, filter 400 includes a first path including a buffer 401A, a resistor $R_{1A}$, and a first RC circuit connected in series between a positive input differential terminal $V_{I+}$ and a positive input differential terminal $V_{O+}$. This first RC circuit includes a resistor $R_{2A}$ and a capacitor $C_{1A}$ connected in parallel. Filter 400 also includes a second path including a buffer 401B, a resistor $R_{1B}$, and a second RC circuit connected in series between a negative input differential terminal $V_{I-}$ and a negative input differential terminal $V_{O-}$. This second RC circuit includes a resistor $R_{2B}$ and a capacitor $C_{1B}$ connected in parallel.

Common mode feedback circuit 404 is connected between the resistors of filter 400. Circuit 404 includes two transconductors $G_+$ and $G_-$, an amplifier 402, and a common mode (CM) sensing circuit 405. In this embodiment, transconductor $G_+$ is connected to a node 406 between resistors $R_{1A}$ and $R_{2A}$, whereas transconductor $G_-$ is connected to a node 407 between resistors $R_{1B}$ and $R_{2B}$. CM sensing circuit 405 has inputs connected to nodes 406 and 407, and an output (providing voltage $V_{XCM}$) connected to a positive terminal of amplifier 402. The negative terminal of amplifier 402 is connected to a common mode reference voltage $V_{CMI}$. An output of amplifier 402 (voltage $V_{error}$) is connected to inputs of transconductors $G_+$ and $G_-$. Both transconductors $G_+$ and $G_-$ and CM sensing circuit 405 can be implemented using standard configurations and therefore are not discussed in detail herein.

In the above-described embodiment of filter 400, CM sensing circuit 405 monitors the voltages $V_{X+}$ and $V_{X-}$ on nodes 406 and 407, respectively, to generate the common mode voltage $V_{XCM}$. Amplifier 402 compares the common mode voltage $V_{XCM}$ with the common mode reference voltage $V_{CMI}$ and amplifies the difference between those voltages to generate voltage $V_{error}$. Voltage $V_{error}$ can be fed back as current though transconductors $G_+$ and $G_-$ to nodes 406 and 407, respectively.

As show in FIG. 4, common mode feedback circuit 404 further includes a differential amplifier 403, which is connected to the RC circuits. In this embodiment, the positive and negative input terminals of differential amplifier 403 are connected to nodes 406 and 407, respectively. The negative and positive output terminals of differential amplifier 403 are connected to the positive and negative output voltage terminals of filter 400, respectively. Differential amplifier 403 also receives a common mode voltage on terminal, $V_{CMO}$ that can be used by its own common-mode feedback circuit to center its outputs.

Figure 5:
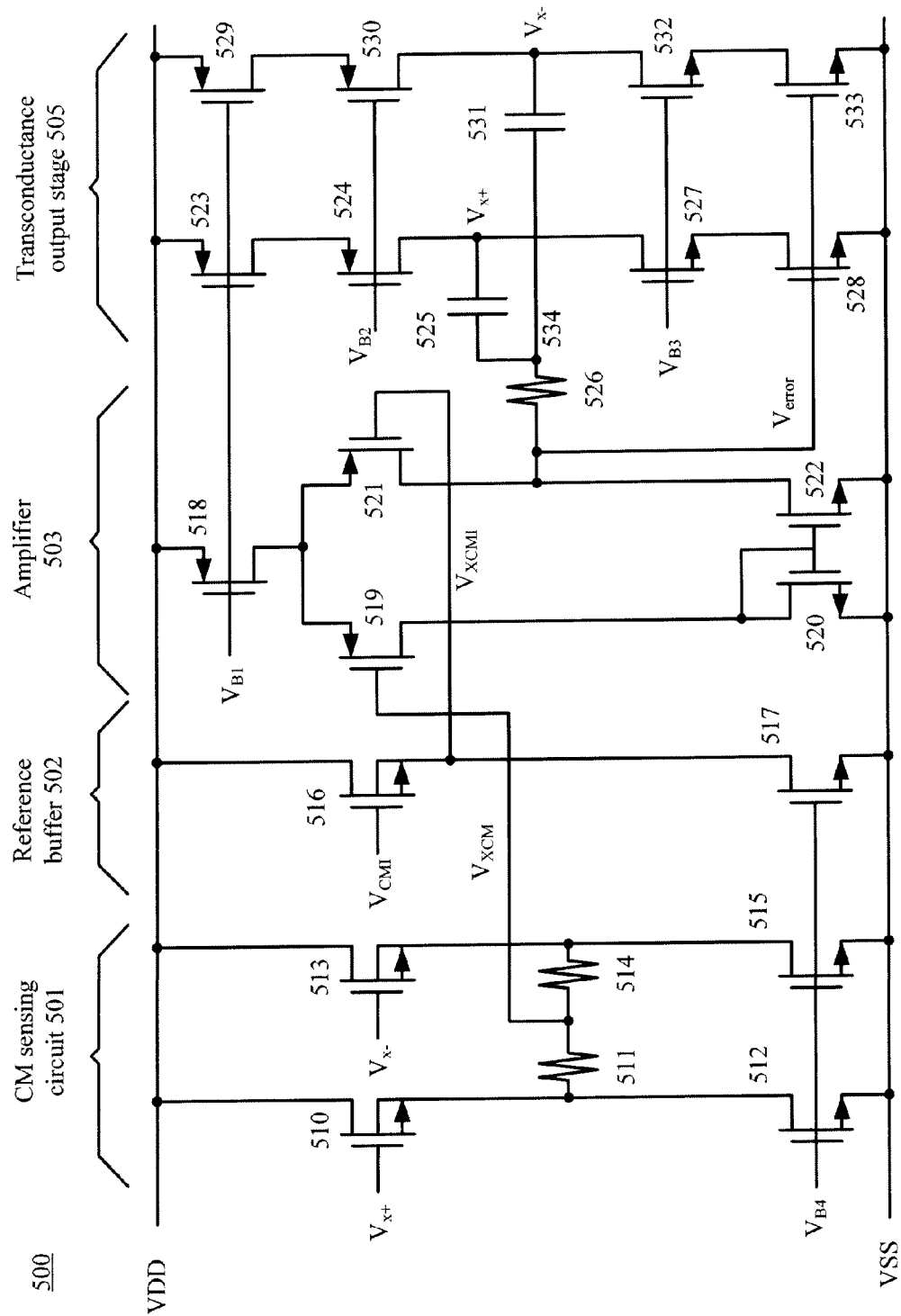
FIG. 5 illustrates an exemplary single-ended-to-differential converter.

FIG. 5 illustrates an exemplary common mode feedback circuit 500, which can be characterized as including a CM sensing circuit 501, a reference buffer 502, an amplifier 503, and a transconductance output stage 505. Note that although components are described as being part of one of 501-505, some components may form part of other component groupings in other embodiments.

CM sensing circuit 501 can include transistors 510, 512, 513, and 515 (all NMOS transistors) as well as resistors 511 and 514. Transistors 510 and 512 can be connected in series between a high voltage source VDD and a low voltage source VSS. Similarly, transistors 513 and 515 can be connected in series between high voltage source VDD and low voltage source VSS. Resistors 511 and 514 are connected in series between the sources of transistors 510 and 513.

Reference buffer 502 can include transistors 516 and 517 (both NMOS transistors) connected in series between VDD and VSS. Amplifier 503 can include transistors 518, 519, and 520 connected in series between VDD and VSS as well as transistors 518, 521, and 522 connected in series between VDD and VSS. Transistors 518, 519, and 521 can be PMOS transistors whereas transistors 520 and 522 can be NMOS transistors.

Transconductance output stage 505 can include transistors 523, 524, 527, and 528 connected in series between VDD and VSS, as well as transistors 529, 530, 532, and 533 connected in series between VDD and VSS. Transistors 523, 524, 529, and 530 can be PMOS transistors whereas transistors 527, 528, 532, and 533 can be NMOS transistors. Transconductance output stage 505 can also include a resistor 526 and capacitors 525 and 531. Resistor 526 and capacitor 531 can be connected in series between the drain of transistor 521 and the drain of transistor 530. Capacitor 525 can be connected between the drain of transistor 524 and a node 534.

Voltages $V_{x+}$, $V_{x-}$, $V_{XCM}$, $V_{CMI}$, and $V_{error}$ correspond to the voltages of FIG. 4 with the same designations. In one embodiment, voltages VB1, VB2, VB3, and VB4 can be provided by a biasing circuit that determine the current flowing in the transistors which gates are connected to these voltages. This biasing circuit can be implemented using standard configurations and therefore is not discussed in detail herein.

In common mode feedback circuit 500, the voltages $V_{x+}$ and $V_{x-}$ are monitored by CM sensing circuit 501. Transistors 510 and 513 offer high input impedance so as not to load the signal nodes. The voltage $V_{XCM}$ is obtained by combining resistors 511 and 514. The CM reference voltage $V_{CMI}$ can be buffered with transistor 516 matched to transistors 510 and 513 so that the voltage drop between gate and source terminals are similar for aligned voltage shift.

Amplifier 503 amplifies the CM error (based on voltages $V_{CMI}$, $V_{XCM}$, and $V_{XCMI}$ (inverted $V_{XCM}$)), then outputs voltage $V_{error}$ to control/drive transistors 528 and 533. As a result, transistors 528 and 533 generate identical output current signals, which are fed back into voltages $V_{x+}$ and $V_{x-}$. This feedback can eliminate the common mode signal in transconductance output stage 505, thereby forcing nodes associated with voltages $V_{x+}$ and $V_{x-}$ to show only the differential component. Note that using cascoded transistors 524, 527, 530, and 532 in transconductor output stage 505 keeps the impedance very high and minimizes any disturbance to the signal paths. Thus, the operation of circuit 500 provides the equivalent of a short circuit to the common mode signal and an open circuit to the differential mode signal.

Filters including common mode feedback can be advantageously applied to almost any type of active open-loop and closed-loop based filter topology, variable gain amplifier, programmable gain amplifier, and buffer. Exemplary filter topologies include, but are not limited by, Active-RC, Unity-follower, Sallen-Key, Tow-Thomas, Ladder or Cauer. Filters including common mode feedback allow fully-differential signal processing and are more robust to interference and crosstalk. This is an essential feature for filters integrated in large integrated circuits where there are many sources of crosstalk and interference due to the close proximity of noisy circuits.

Although illustrative embodiments of the invention have been described in detail herein with reference to the accompanying figures, it is to be understood that the invention is not limited to those precise embodiments. For example, in one embodiment the implementation of the different blocks within 304 or 404 could be different from FIG. 5 but still include the functions of obtaining the common-mode of Vx+/Vx− and re-introducing a proportional current into the same nodes as a feedback. Also note that the transistors in FIG. 5 could be different types (e.g. NMOS or PMOS) by inverting their supply connection. Further note that the resistor designations in different embodiments may have different values, i.e. such designations are for ease of reference and do not necessarily indicate similarity. As such, many modifications and variations will be apparent. Accordingly, it is intended that the scope of the invention be defined by the following Claims and their equivalents.

The invention claimed is:

1. A filter for providing single-ended to differential-ended signal conversion, the filter comprising:
   a first buffer receiving an analog signal;
   a first resistor;
   a second resistor;
   a second buffer, wherein the first buffer, the first resistor, the second resistor, and the second buffer are connected in series;
   a first capacitor connected between an input of the second buffer and a low voltage source;
   a third buffer receiving a DC signal;
   a third resistor;
   a fourth resistor;
   a fourth buffer, wherein the third buffer, the third resistor, the fourth resistor, and the fourth buffer are connected in series;
   a second capacitor connected between an input of the fourth buffer and the low voltage source; and
   a common mode feedback circuit connected between the first and the second resistors as well as between the third and the fourth resistors,
   wherein the common mode feedback circuit compares a common mode voltage and a reference voltage and, based on that comparison, modifies voltages on the second and the fourth resistors by application of current,
   wherein the second buffer outputs a first differential voltage and the fourth buffer outputs a second differential voltage.

2. The filter of claim 1, wherein the common mode feedback circuit includes:
   a common mode sensing circuit for receiving a first voltage output by the first resistor and a second voltage output by the third resistor, the common mode sensing circuit generating the common mode voltage.

3. The filter of claim 2, wherein the common mode feedback circuit further includes:
   an amplifier for receiving the common mode voltage on a positive input terminal and the reference voltage on a negative input terminal.

4. The filter of claim 3, wherein the common mode feedback circuit further includes:
   a first transconductor connected between an output of the amplifier and a first node between the first and the second resistors.

5. The filter of claim 4, wherein the common mode feedback circuit further includes:
   a second transconductor connected between the output of the amplifier and a second node between the third and the fourth resistors.

6. A filter for providing single-ended to differential-ended signal conversion, the filter comprising:
   a first buffer receiving an analog signal;
   a first resistor;
   a first RC network, wherein the first buffer, the first resistor, and the first RC network are connected in series, the first RC network including a second resistor and a first capacitor connected in parallel;
   a second buffer receiving a DC signal;
   a third resistor;
   a second RC network, wherein the second buffer, the third resistor, and the second RC network are connected in series, the second RC network including a fourth resistor and a second capacitor connected in parallel;
   a common mode feedback circuit connected between the first and the second resistors as well as between the third and the fourth resistors; and
   a differential amplifier connected to the first and the second RC networks,
   wherein the common mode feedback circuit compares a common mode voltage and a reference voltage and, based on that comparison, modifies voltages on the second and the fourth resistors by application of current,
   wherein the first RC network outputs a first differential voltage and the second RC network outputs a second differential voltage.

7. The filter of claim 6, wherein the common mode feedback circuit includes:
   a common mode sensing circuit for receiving a first voltage output by the first resistor and a second voltage output by the third resistor, the common mode sensing circuit generating the common mode voltage.

8. The filter of claim 7, wherein the common mode feedback circuit further includes:
   an amplifier for receiving the common mode voltage on a positive input terminal and the reference voltage on a negative input terminal.

9. The filter of claim 8, wherein the common mode feedback circuit further includes:
   a first transconductor connected between an output of the amplifier and a first node between the first and the second resistors.

10. The filter of claim 9, wherein the common mode feedback circuit further includes:
    a second transconductor connected between the output of the amplifier and a second node between the third and the fourth resistors.

11. The filter of claim 10, wherein the differential amplifier includes a positive input terminal connected to an input of the first RC network and a negative input terminal connected to an input of the second RC network.

12. The filter of claim 11, wherein the differential amplifier includes a negative output terminal connected to an output of the first RC network and a positive output terminal connected to an output of the second RC network.

13. The filter of claim 12, wherein the output of the negative output terminal of the differential amplifier provides a negative differential output of the filter.

14. The filter of claim 12, wherein the output of the positive output terminal of the differential amplifier provides a positive differential output of the filter.

15. The filter of claim 12, wherein the differential amplifier includes a common mode voltage terminal.

* * * * *